United States Patent
Omori et al.

(10) Patent No.: US 11,908,703 B2
(45) Date of Patent: Feb. 20, 2024

(54) LIGHT IRRADIATION TYPE HEAT TREATMENT METHOD

(71) Applicant: SCREEN Holdings Co., Ltd., Kyoto (JP)

(72) Inventors: Mao Omori, Kyoto (JP); Kazuhiko Fuse, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 17/370,026

(22) Filed: Jul. 8, 2021

(65) Prior Publication Data
US 2022/0037164 A1 Feb. 3, 2022

(30) Foreign Application Priority Data

Jul. 31, 2020 (JP) ................................. 2020-130373

(51) Int. Cl.
*H01L 21/324* (2006.01)
*H01L 21/67* (2006.01)
(Continued)

(52) U.S. Cl.
CPC ........ *H01L 21/324* (2013.01); *H01L 21/2686* (2013.01); *H01L 21/67103* (2013.01); (Continued)

(58) Field of Classification Search
CPC ............... H01L 21/2686; H01L 21/324; H01L 21/67115; H01L 21/68707; H01L 21/67103; H05B 3/0047
See application file for complete search history.

(56) References Cited

U.S. PATENT DOCUMENTS

| 2001/0047990 A1 | 12/2001 | Yoo |
| 2013/0109109 A1 | 5/2013 | Shibagaki et al. |

(Continued)

FOREIGN PATENT DOCUMENTS

| JP | 2017-092102 A | | 5/2017 | |
| JP | 2021-136376 | * | 9/2021 | ............ H01L 21/26 |

(Continued)

OTHER PUBLICATIONS

Office Action and Search Report dated Jan. 11, 2022 in corresponding Taiwanese Patent Application No. 110127540 with partial English translation based on the Japanese translation.
(Continued)

*Primary Examiner* — Mary A Wilczewski
(74) *Attorney, Agent, or Firm* — OSTROLENK FABER LLP

(57) ABSTRACT

Heating treatment is performed on multiple dummy wafers to preheat in-chamber structures including a susceptor and the like prior to the treatment of a semiconductor wafer to be treated. The first few ones of the multiple dummy wafers are heated to a first heating temperature by light irradiation from halogen lamps, and are thereafter irradiated with a flash of light. The subsequent few ones of the multiple dummy wafers are heated to a second heating temperature lower than the first heating temperature by light irradiation from the halogen lamps, and are thereafter irradiated with a flash of light. This stabilizes the temperature of the in-chamber structures in a shorter time with fewer dummy wafers because the dummy wafers are heated to the high temperature and thereafter heated to the low temperature.

7 Claims, 11 Drawing Sheets

(51) Int. Cl.
    *H01L 21/268*    (2006.01)
    *H01L 21/687*    (2006.01)
    *H05B 3/00*      (2006.01)

(52) U.S. Cl.
    CPC ...... *H01L 21/67115* (2013.01); *H05B 3/0047* (2013.01); *H01L 21/68707* (2013.01)

(56) References Cited

U.S. PATENT DOCUMENTS

| | | | |
|---|---|---|---|
| 2017/0011923 A1* | 1/2017 | Tanimura | H01L 21/67115 |
| 2017/0053818 A1* | 2/2017 | Aoyama | H01L 21/67248 |
| 2017/0125312 A1* | 5/2017 | Ono | C23C 14/48 |
| 2017/0178979 A1* | 6/2017 | Furukawa | H01L 21/67115 |
| 2018/0166281 A1* | 6/2018 | Fuse | H01L 29/66575 |
| 2018/0261477 A1* | 9/2018 | Ito | H01L 21/6719 |
| 2018/0358234 A1* | 12/2018 | Ono | H01L 21/67115 |
| 2019/0141790 A1* | 5/2019 | Ito | H01L 21/67115 |
| 2019/0393054 A1* | 12/2019 | Ono | H01L 21/324 |
| 2020/0098601 A1 | 3/2020 | Ueno et al. | |
| 2020/0126807 A1 | 4/2020 | Ikeda | |
| 2020/0126808 A1 | 4/2020 | Ikeda | |
| 2020/0144084 A1 | 5/2020 | Ikeda | |
| 2021/0272823 A1* | 9/2021 | Omori | H01L 21/67248 |
| 2022/0037164 A1* | 2/2022 | Omori | H01L 21/67115 |

FOREIGN PATENT DOCUMENTS

| | | |
|---|---|---|
| KR | 10-2020-0033733 A | 3/2020 |
| KR | 10-2020-0045963 A | 5/2020 |
| KR | 10-2020-0045970 A | 5/2020 |
| KR | 10-2020-0051483 A | 5/2020 |
| TW | 200614460 A | 5/2006 |
| TW | 201903903 | 1/2019 |
| TW | 201923905 | 6/2019 |
| TW | 202002084 A | 1/2020 |
| WO | WO-2019146166 A1 * | 8/2019 ........... H01L 21/265 |

OTHER PUBLICATIONS

Office Action dated Jul. 19, 2022 in corresponding Taiwanese Patent Application No. 110127540 with partial English translation based on the Japanese translation.
Request for the Submission of an Opinion dated Apr. 17, 2023 in corresponding Korean Patent Application No. 10-2021-0099800 and a computer generated English translation obtained from the JPO.
Notice of Opinion on Examination dated Sep. 22, 2023 in corresponding Taiwanese Patent Application No. 110127540 and a machine English language translation made from the Japanese translation of the original communication.
Notice of Decision to Grant dated Oct. 26, 2023 in corresponding Korean Patent Application No. 10-2021-0099800.

* cited by examiner

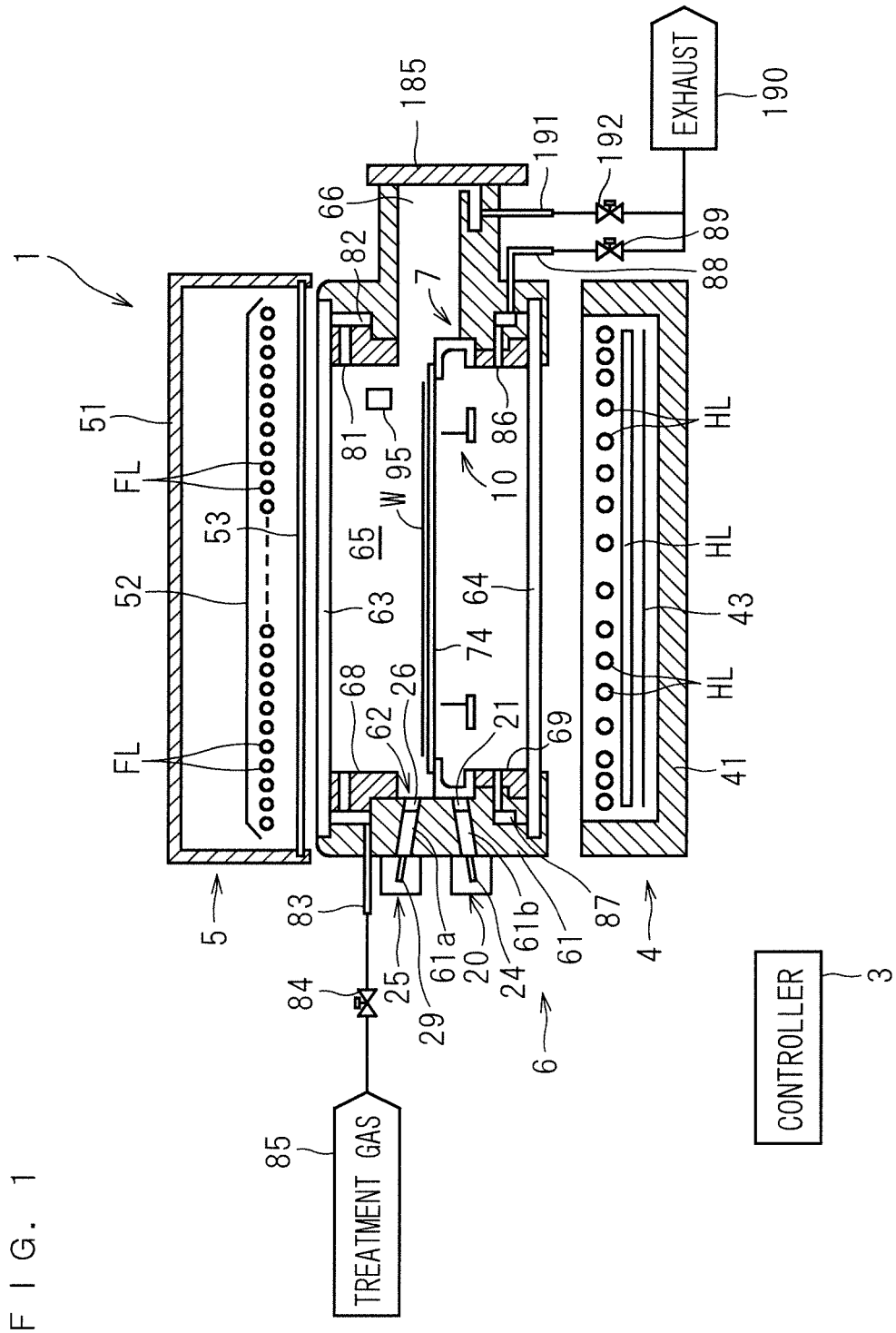
F I G. 1

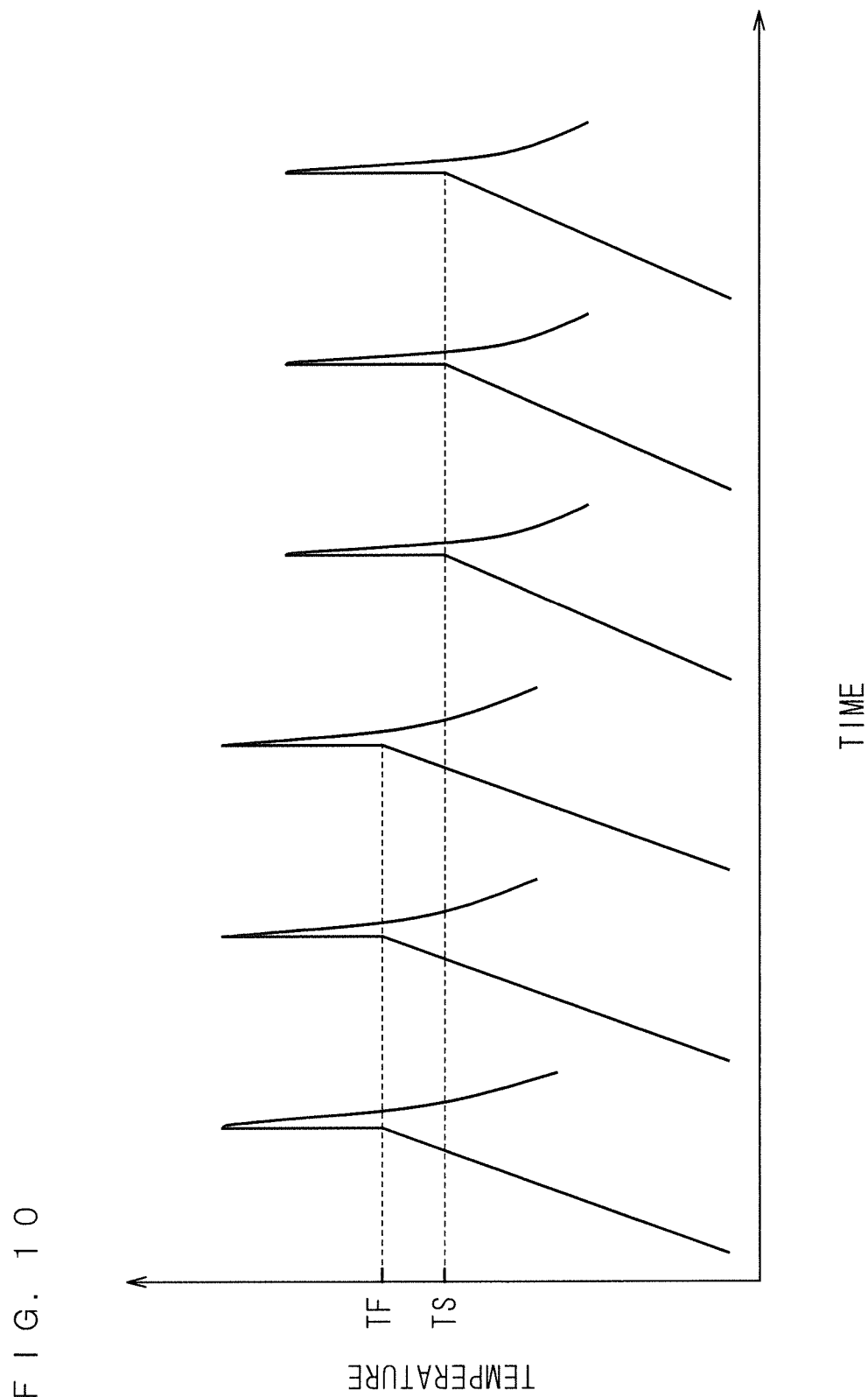

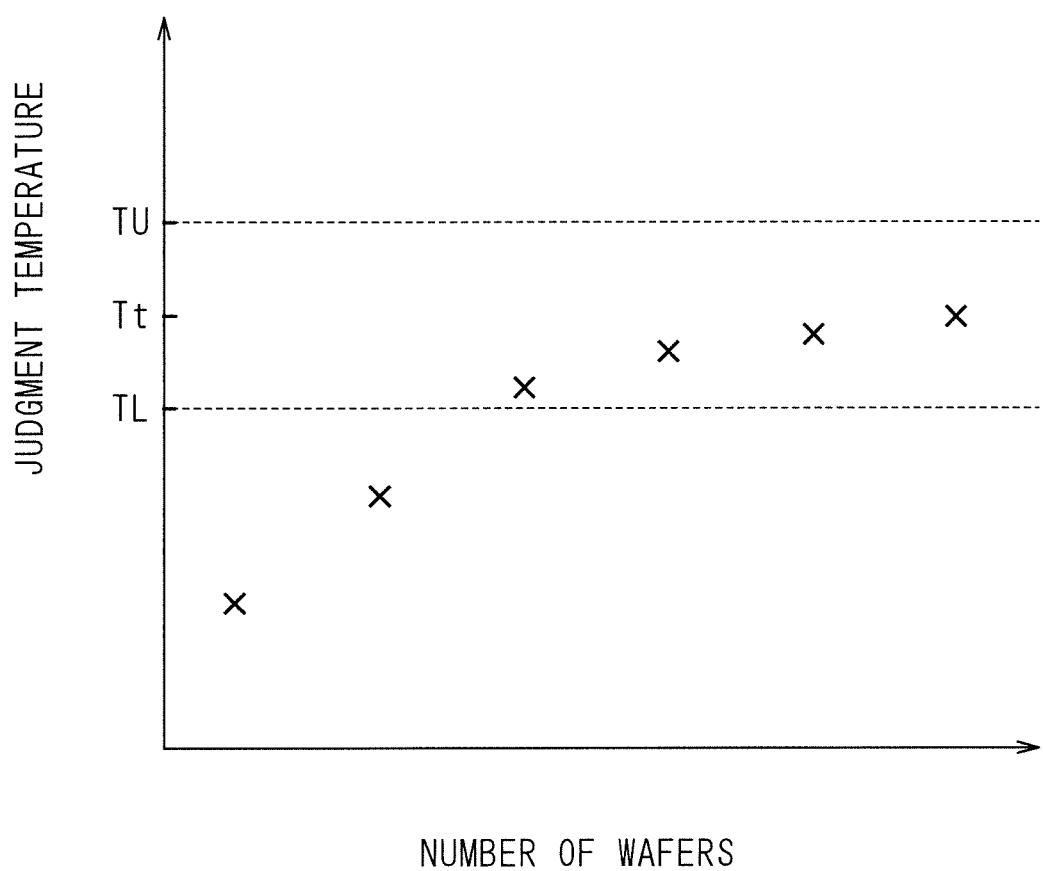
F I G. 1 1

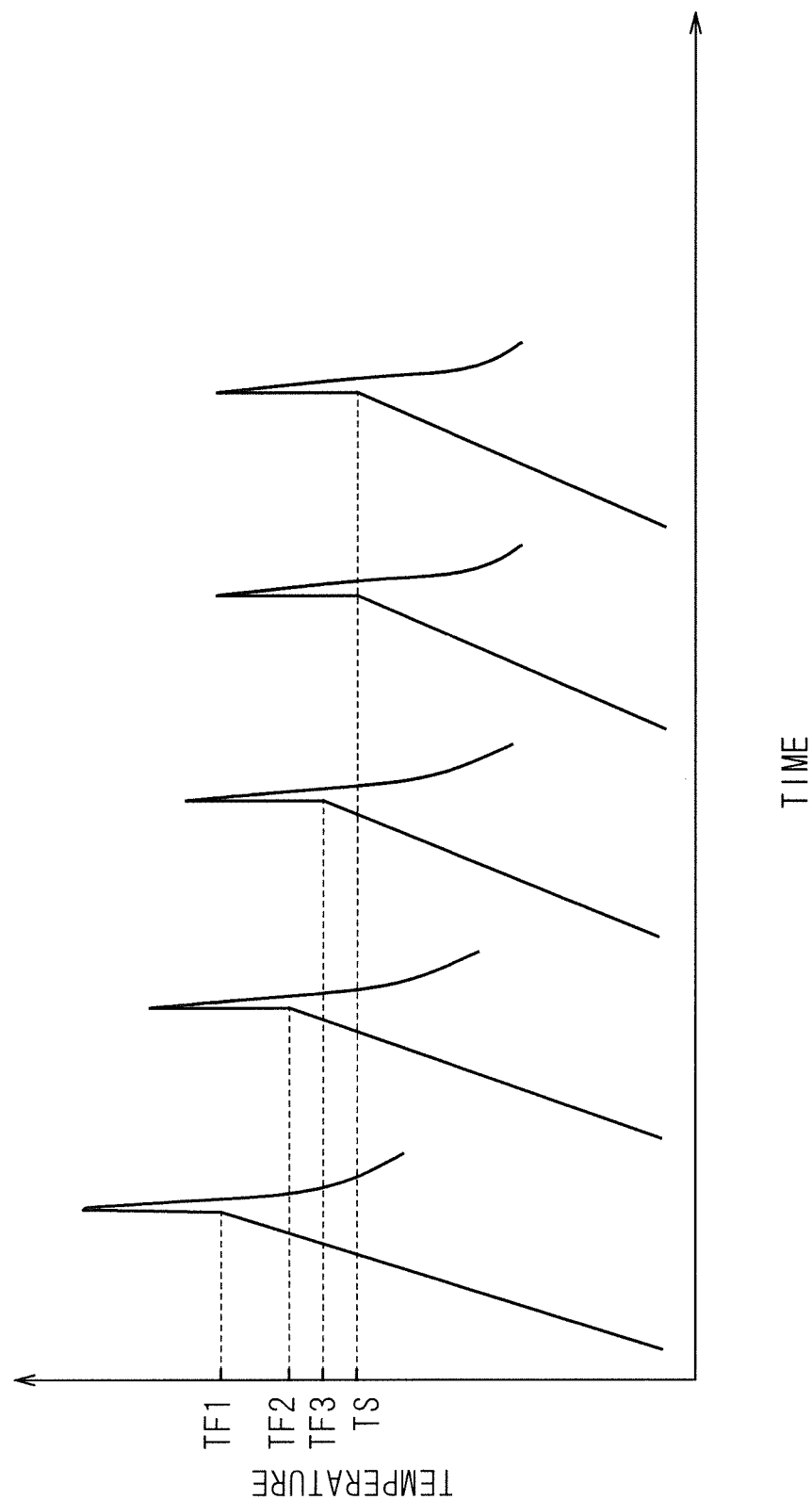

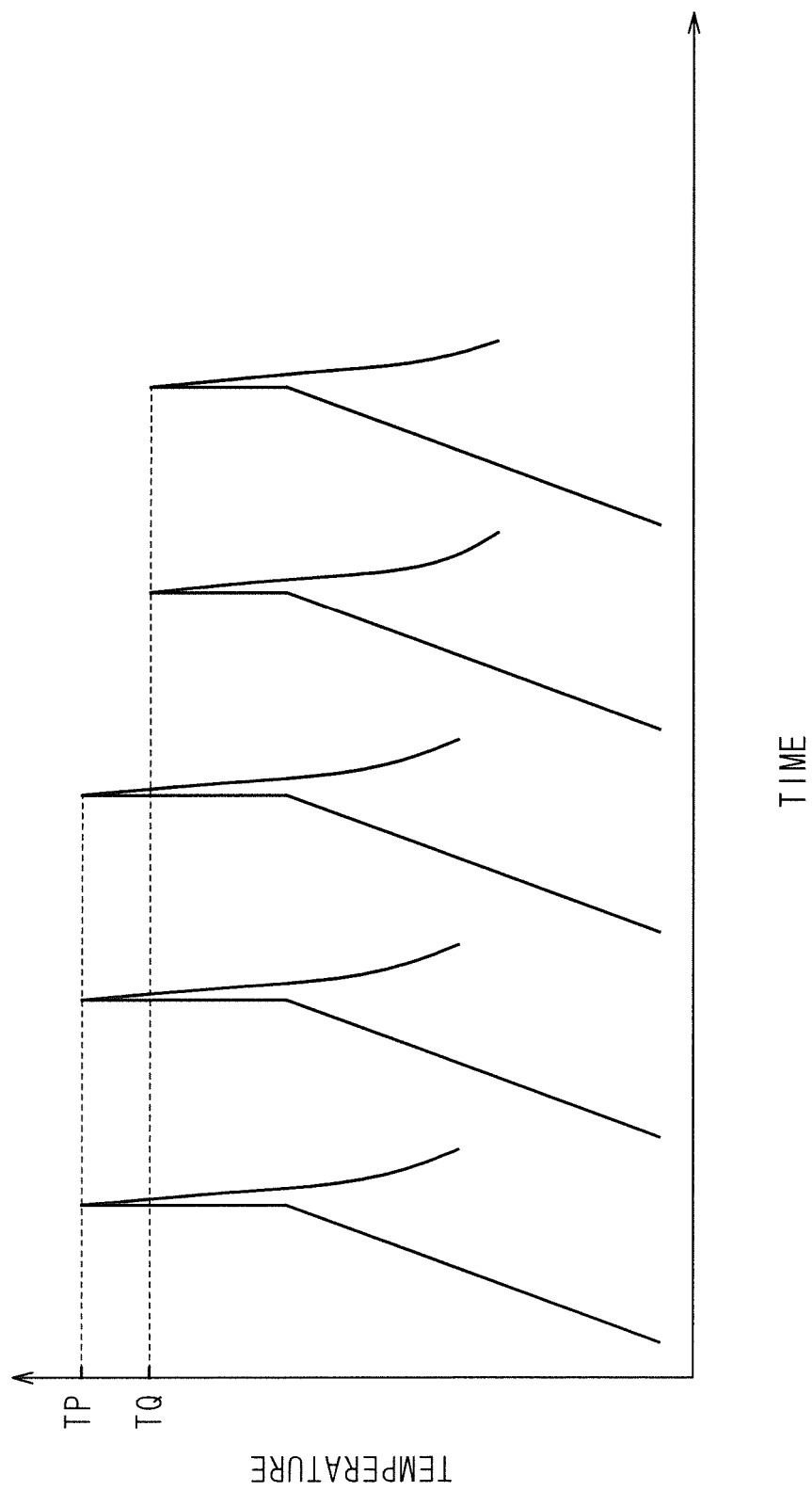

LIGHT IRRADIATION TYPE HEAT TREATMENT METHOD

BACKGROUND OF THE INVENTION

Field of the Invention

The present invention relates to a heat treatment method which irradiates a thin plate-like precision electronic substrate (hereinafter referred to simply as a "substrate") such as a semiconductor wafer with light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of a surface of a semiconductor wafer implanted with impurities by an ion implantation process with a flash of light emitted from flash lamps allows the temperature rise only in the surface of the semiconductor wafer to an activation temperature for an extremely short time, thereby achieving only the activation of the impurities without deep diffusion of the impurities.

Typically, not only heat treatment but also processing or treatment of semiconductor wafers is performed lot by lot (a group of semiconductor wafers subjected to the same processing or treatment under the same conditions). In a single-wafer type substrate processing apparatus, semiconductor wafers in a lot are processed sequentially in succession. In a flash lamp annealer, semiconductor wafers in a lot are also transported one by one into a chamber and heat-treated sequentially.

Unfortunately, the temperature of in-chamber structures (structures in a chamber) including a susceptor for holding a semiconductor wafer and the like changes in some cases in the course of the sequential processing or treatment of semiconductor wafers in a lot. Such a phenomenon occurs when new treatment starts in a flash lamp annealer which has been in a nonoperational condition for some time or when treatment conditions including a treatment temperature of semiconductor wafers and the like are changed. Changes in temperature of the in-chamber structures including the susceptor and the like in the course of the treatment of semiconductor wafers in a lot give rise to a problem that there arises a difference in temperature history during the treatment between initial semiconductor wafers and latter semiconductor wafers in the lot.

To solve such a problem, it has been common practice that dummy wafers not to be treated are transported into the chamber and supported by the susceptor prior to the start of the treatment of product wafers in a lot, and heating treatment is performed on the dummy wafers under the same conditions as on the lot to be treated, whereby the temperature of the in-chamber structures including the susceptor and the like is increased in advance to a stable temperature (dummy running). U.S. Patent Application Publication No. 2017/0125312 discloses that heat treatment is performed on approximately ten dummy wafers, so that the temperature of the in-chamber structures including the susceptor and the like reaches the stable temperature for the treatment.

Performing the dummy running by consuming a plurality of dummy wafers prior to the treatment of the product wafers that become products leads to an increase in running costs and a reduction in production efficiency. For this reason, there is a strong need to minimize the number of dummy wafers consumed in the dummy running to shorten the time for the dummy running.

SUMMARY

The present invention is intended for a method of irradiating a substrate with light to heat the substrate.

According to one aspect of the present invention, the method comprises the steps of: (a) sequentially transporting multiple dummy wafers into a chamber and placing the dummy wafers on a susceptor before a substrate to be treated is transported into the chamber; (b) irradiating a back surface of each dummy wafer in a first group among the multiple dummy wafers with light from a continuous lighting lamp to heat each dummy wafer in the first group to a first heating temperature, and thereafter irradiating a front surface of each dummy wafer in the first group with a flash of light from a flash lamp to heat each dummy wafer in the first group; and (c) irradiating a back surface of each dummy wafer in a second group among the multiple dummy wafers with light from the continuous lighting lamp to heat each dummy wafer in the second group to a second heating temperature lower than the first heating temperature, and thereafter irradiating a front surface of each dummy wafer in the second group with a flash of light from the flash lamp to heat each dummy wafer in the second group, the step (c) being performed after the step (b).

The dummy wafers are heated to the high temperature and thereafter heated to the low temperature. This stabilizes the temperature in the chamber efficiently in a short time.

Preferably, the second heating temperature is a temperature to which the substrate to be treated is heated by irradiating the substrate with light from the continuous lighting lamp.

This allows the temperature in the chamber to be stabilized to the temperature at which the substrate to be treated is treated.

According to another aspect of the present invention, the method comprises the steps of: (a) sequentially transporting multiple dummy wafers into a chamber and placing the dummy wafers on a susceptor before a substrate to be treated is transported into the chamber; (b) irradiating a back surface of each dummy wafer in a first group among the multiple dummy wafers with light from a continuous lighting lamp, and thereafter irradiating a front surface of each dummy wafer in the first group with a flash of light from a flash lamp to heat each dummy wafer in the first group to a first heating temperature; and (c) irradiating a back surface of each dummy wafer in a second group among the multiple dummy wafers with light from the continuous lighting lamp, and thereafter irradiating a front surface of each dummy wafer in the second group with a flash of light from the flash lamp to heat each dummy wafer in the second group to a second heating temperature lower than the first heating temperature, the step (c) being performed after the step (b).

The dummy wafers are heated to the high temperature and thereafter heated to the low temperature. This stabilizes the temperature in the chamber efficiently in a short time.

It is therefore an object of the present invention to stabilize the temperature in a chamber efficiently in a short time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal sectional view showing a configuration of a heat treatment apparatus for carrying out a heat treatment method according to the present invention;

FIG. 10 is a graph showing changes in temperature of multiple dummy wafers during the dummy treatment according to the first preferred embodiment;

FIG. 11 is a graph showing transitions of a judgment temperature;

FIG. 12 is a graph showing changes in temperature of multiple dummy wafers during the dummy treatment according to a second first preferred embodiment; and FIG. 13 is a graph showing changes in temperature of multiple dummy wafers during the dummy treatment according to a third preferred embodiment.

DESCRIPTION OF THE PREFERRED EMBODIMENTS

Figure 2:
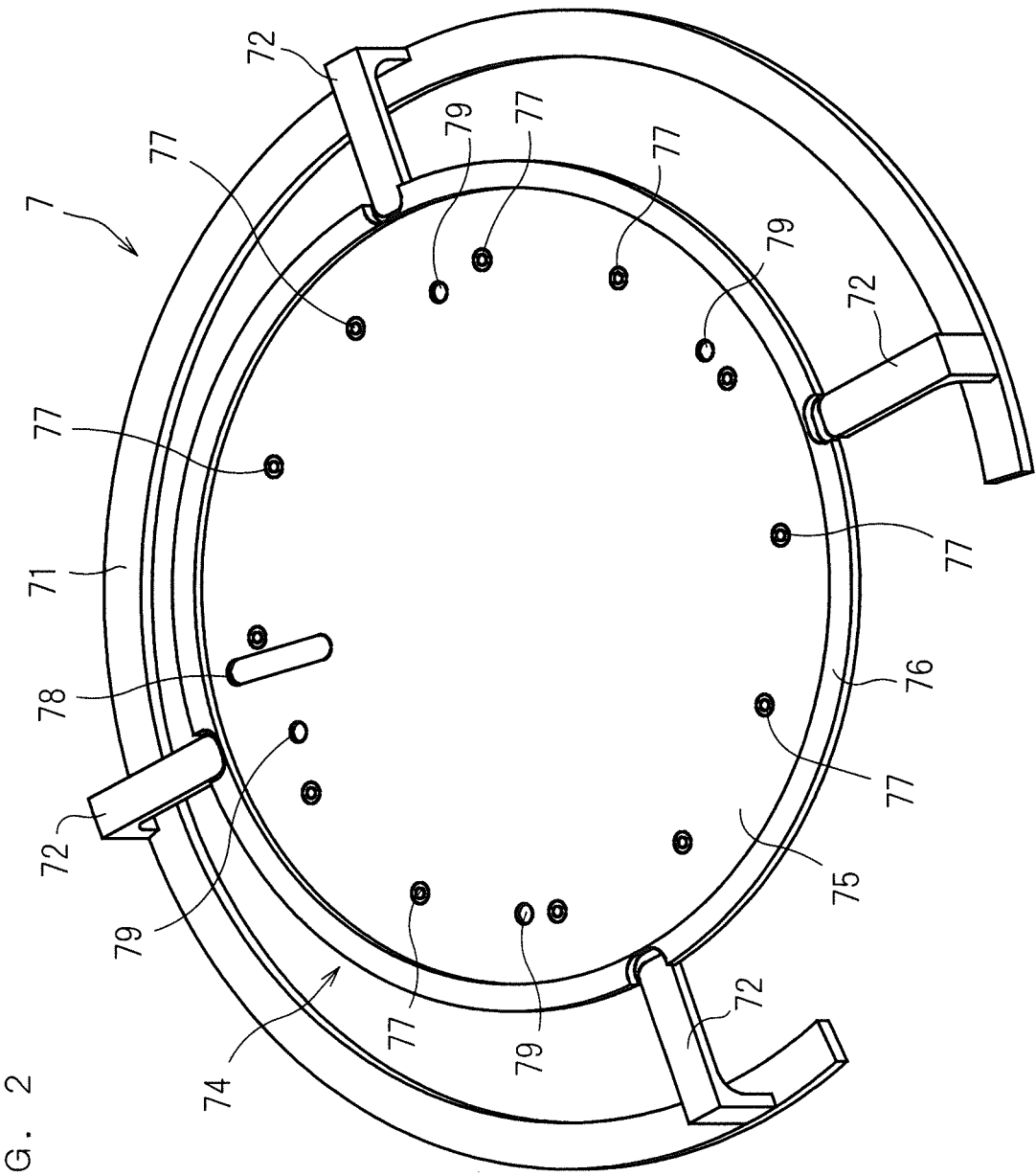
FIG. 2 is a perspective view showing the entire external appearance of a holder.

Preferred embodiments according to the present invention will now be described in detail with reference to the drawings.

First Preferred Embodiment

FIG. 1 is a longitudinal sectional view showing a configuration of a heat treatment apparatus 1 for carrying out a heat treatment method according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a and a through hole 61b both bored therein. The through hole 61a is a cylindrical hole for directing infrared radiation emitted from an upper surface of a semiconductor wafer W held by a susceptor 74 to be described later therethrough to an infrared sensor 29 of an upper radiation thermometer 25. The through hole 61b is a cylindrical hole for directing infrared radiation emitted from a lower surface of the semiconductor wafer W therethrough to an infrared sensor 24 of a lower radiation thermometer 20. The through hole 61a and the through hole 61b are inclined with respect to a horizontal direction so that the longitudinal axes (axes extending in respective directions in which the through holes 61a and 61b extend through the chamber side portion 61) of the respective through holes 61a and 61b intersect main surfaces of the semiconductor wafer W held by the susceptor 74. A transparent window 26 made of calcium fluoride material transparent to infrared radiation in a wavelength range measurable with the upper radiation thermometer 25 is mounted to an end portion of the through hole 61a which faces the heat treatment space 65. A transparent window 21 made of barium fluoride material transparent to infrared radiation in a wavelength range measurable with the lower radiation thermometer 20 is mounted to an end portion of the through hole 61b which faces the heat treatment space 65.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is interposed in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in the present preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is interposed in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
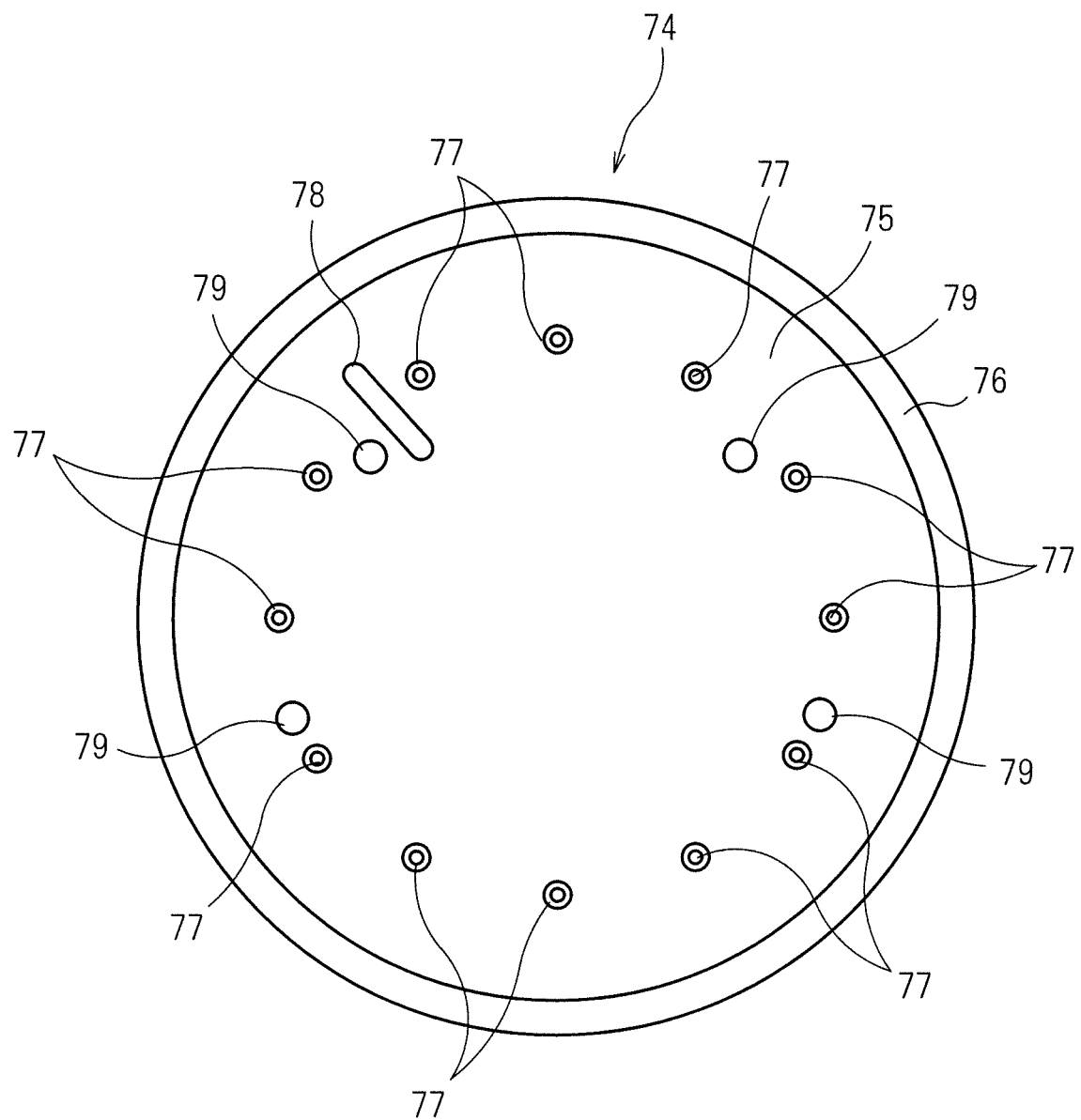
FIG. 3 is a plan view of a susceptor.
Figure 4:
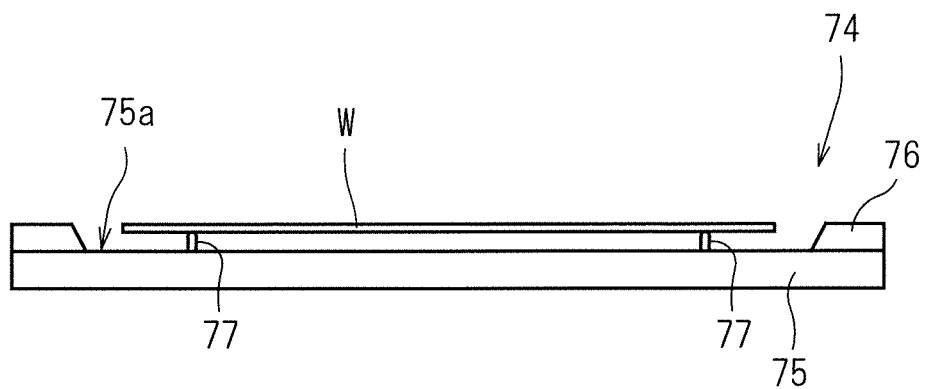
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for the lower radiation thermometer 20 to receive radiation (infrared radiation) emitted from the lower surface of the semiconductor wafer W. Specifically, the lower radiation thermometer 20 receives the radiation emitted from the lower surface of the semiconductor wafer W through the opening 78 and the transparent window 21 mounted to the through hole 61b in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
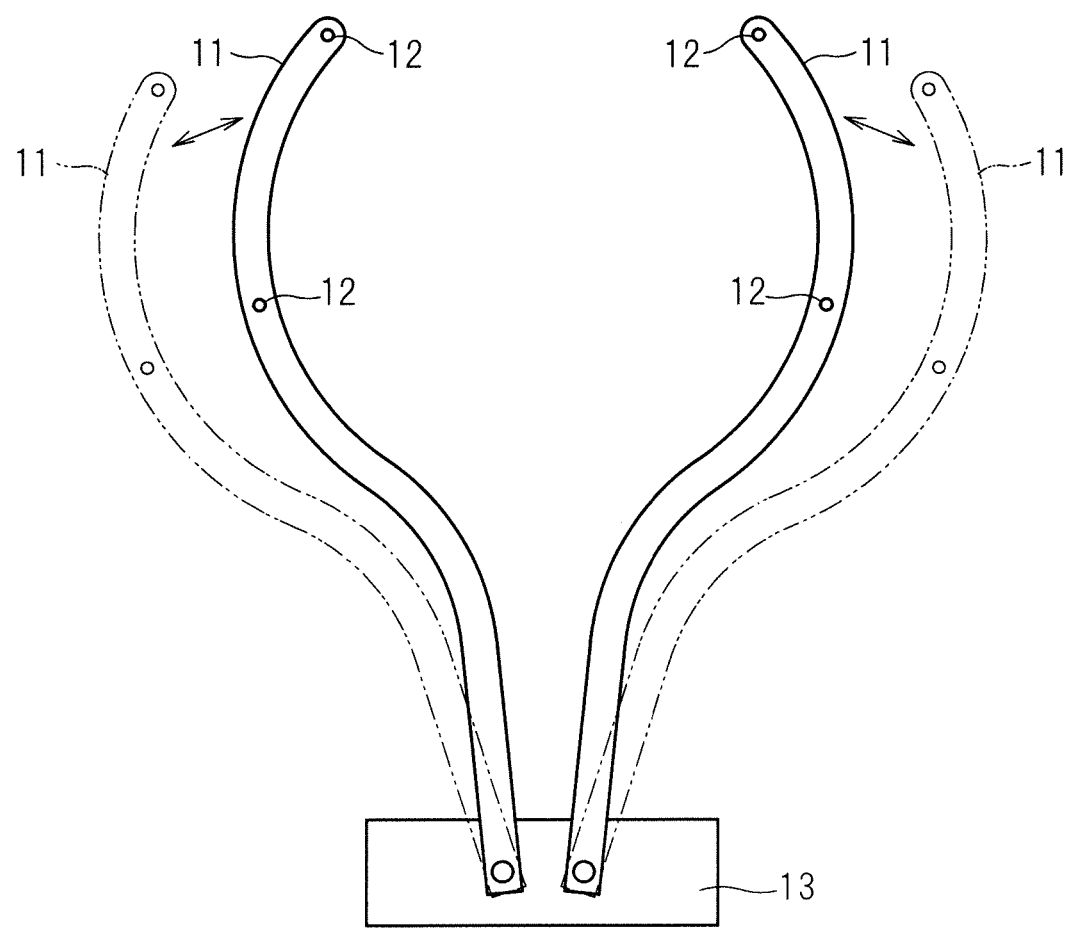
FIG. 5 is a plan view of a transfer mechanism.
Figure 6:
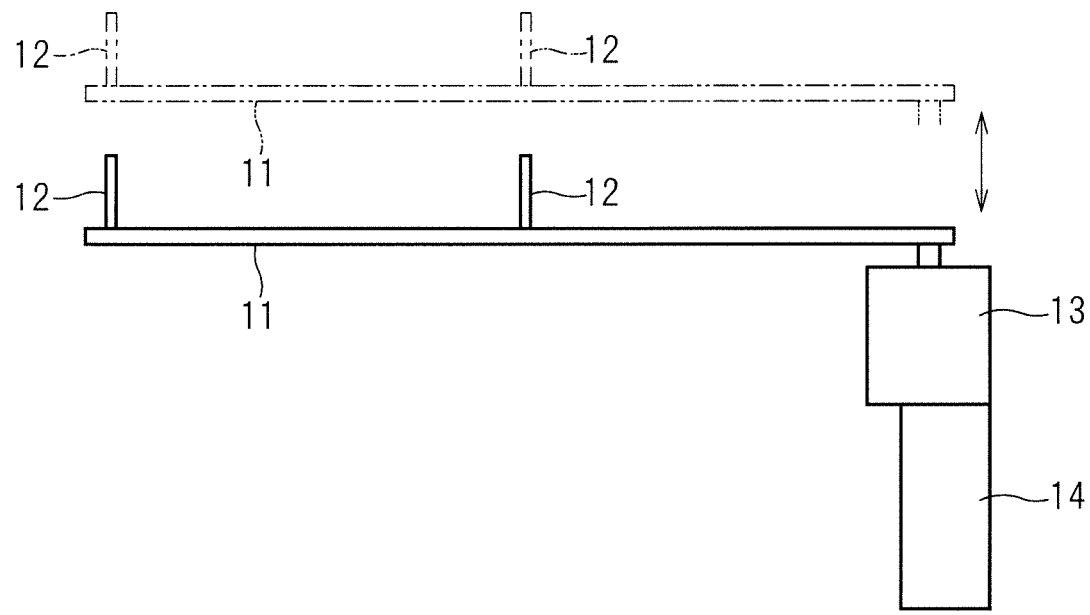
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
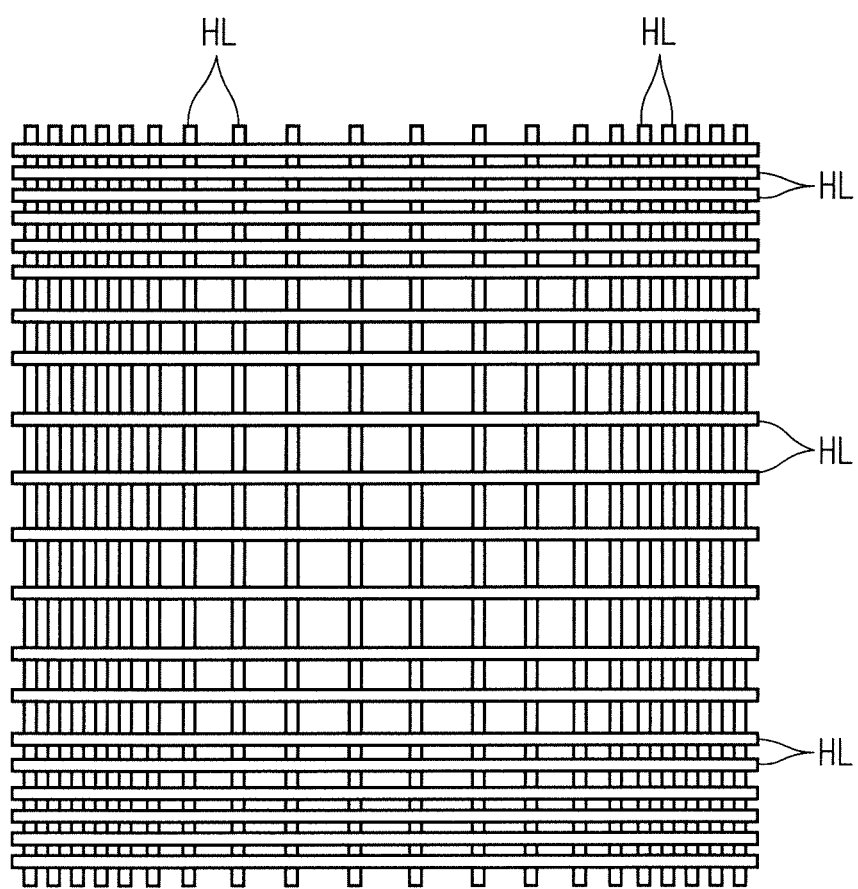
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

As shown in FIG. 1, the chamber 6 is provided with the two radiation thermometers (in the present preferred embodiment, pyrometers): the upper radiation thermometer 25 and the lower radiation thermometer 20. The upper radiation thermometer 25 is provided obliquely above the semiconductor wafer W held by the susceptor 74, and receives the infrared radiation emitted from the upper surface of the semiconductor wafer W to measure the temperature of the upper surface of the semiconductor wafer W. The infrared sensor 29 of the upper radiation thermometer 25 includes an optical element made of InSb (indium antimonide) so as to be able to respond rapid changes in temperature of the upper surface of the semiconductor wafer W at the moment of flash irradiation. On the other hand, the lower radiation thermometer 20 is provided obliquely below the semiconductor wafer W held by the susceptor 74, and receives the infrared radiation emitted from the lower surface of the semiconductor wafer W to measure the temperature of the lower surface of the semiconductor wafer W. The chamber 6 is also provided with a temperature sensor 95. The temperature sensor 95 measures the temperature of an atmosphere in the chamber 6.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a treatment operation in the heat treatment apparatus 1 will be described. A heat treatment operation for an ordinary semiconductor wafer (product wafer) W that becomes a product will be described first. A procedure for the treatment of the semiconductor wafer W which will be described below proceeds under the control of the controller 3 over the operating mechanisms of the heat treatment apparatus 1.

Prior to the treatment of the semiconductor wafer W, the valve 84 for supply of gas is opened, and the valve 89 for exhaust of gas is opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W to be treated through the transport opening 66 into the heat treatment space 65 of the chamber 6. At this time, there is a danger that an atmosphere outside the heat treatment apparatus 1 is carried into the heat treatment space 65 as the semiconductor wafer W is transported into the heat treatment space 65. However, the nitrogen gas is continuously supplied into the chamber 6. Thus, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof that is a surface to be treated is the upper surface. A predetermined distance is defined between a back surface (a main surface opposite from the front surface) of the semiconductor wafer W supported by the substrate support pins 77 and the holding surface 75*a* of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held from below in a horizontal attitude by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W which is on the increase by the irradiation with light from the halogen lamps HL is measured with the lower radiation thermometer 20. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the lower radiation thermometer 20.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the lower radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL in the flash heating part 5 irradiate the front surface of the semiconductor wafer W held by the susceptor 74 with a flash of light at the point in time when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher, and thereafter decreases rapidly.

After a predetermined time period has elapsed since the completion of the flash heating treatment, the halogen lamps HL turn off. This causes the temperature of the semiconductor wafer W to decrease rapidly from the preheating temperature T1. The lower radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 out of the chamber 6. Thus, the heating treatment of the semiconductor wafer W is completed.

Typically, the treatment of semiconductor wafers W is performed on a lot-by-lot basis. The term "lot" refers to a group of semiconductor wafers W subjected to the same treatment under the same conditions. In the heat treatment apparatus 1 according to the present preferred embodiment, multiple semiconductor wafers W in a lot are sequentially transported one by one into the chamber 6 and subjected to the heating treatment.

For the start of the treatment of a lot in the heat treatment apparatus 1 that has not performed the treatment for some period of time, the first semiconductor wafer W in the lot is transported into the chamber 6 that is at approximately room temperature and is then subjected to the heating treatment. Examples of this case are such that the heat treatment apparatus 1 starts up after maintenance and then treats the first lot or such that a long time period has elapsed since the treatment of the preceding lot. During the heating treatment, heat transfer occurs from the semiconductor wafer W increased in temperature to the susceptor 74. For this reason, the temperature of the susceptor 74 that is initially at room temperature increases gradually due to heat storage as the number of treated semiconductor wafers W increases.

When the heating treatment is performed on approximately ten semiconductor wafers W, the temperature of in-chamber structures (structures in the chamber) including the susceptor 74 and the like reaches a constant stabilized temperature. Before the temperature of the susceptor 74 reaches the stabilized temperature, the amount of heat transferred from the semiconductor wafer W to the susceptor 74 is greater than the amount of heat dissipated from the susceptor 74, so that the temperature of the susceptor 74 increases gradually due to heat storage as the number of treated semiconductor wafers W increases. On the other hand, after the temperature of the susceptor 74 reaches the stabilized temperature, the amount of heat transferred from the semiconductor wafer W to the susceptor 74 and the amount of heat dissipated from the susceptor 74 are balanced with each other, so that the temperature of the susceptor 74 is maintained at the constant stabilized temperature. The stabilized temperature of the in-chamber structures including the susceptor 74 and the like refers to the temperature of the in-chamber structures obtained when the heating treatment performed on a plurality of semiconductor wafers W in a lot in succession within the chamber 6 without the preheating of the in-chamber structures causes the temperature of the in-chamber structures to increase to a constant temperature.

If the treatment of a lot is started in the chamber 6 that is at room temperature in this manner, a semiconductor wafer W is held by the susceptor 74 that is near room temperature in the early stage of the treatment while a semiconductor wafer W is held by the susceptor 74 that has been increased in temperature to the stabilized temperature in the latter half of the treatment. That is, there has been a problem that a non-uniform temperature history results from a difference in temperature of the in-chamber structures including the susceptor 74 and the like between initial semiconductor wafers W in the lot and intermediate semiconductor wafers W in the lot. To solve the problem, dummy running (dummy treatment) is performed prior to the start of the treatment of the semiconductor wafers W to be treated in the present preferred embodiment. The dummy running (dummy treatment) is a technique in which dummy wafers not to be treated are transported into the chamber 6 and are subjected to the heating treatment, whereby the in-chamber structures including the susceptor 74 and the like are preheated. Such dummy treatment is performed not only in the case of starting the treatment of a lot in the chamber 6 that is at room temperature but also in the case of changing the preheating temperature T1 and the treatment temperature T2. The dummy treatment according to the present preferred embodiment will be described below.

The dummy treatment is performed by transporting dummy wafers not to be treated into the chamber 6, and then performing the heating treatment by means of the light irradiation from the halogen lamps HL and the heating treatment by means of the flash irradiation from the flash lamps FL on the dummy wafers. The dummy wafers are disk-shaped silicon wafers similar to the semiconductor wafers W that become products, and are similar in size and shape to the semiconductor wafers W. The dummy wafers, however, are neither patterned nor implanted with ions. That is, the dummy wafers are what is called bare wafers.

First, the dummy treatment for a single dummy wafer will be briefly described. The dummy wafer is initially transported into the chamber 6. The transport of the dummy wafer into the chamber 6 is similar in procedure to the aforementioned transport of the semiconductor wafer W into the chamber 6. The dummy wafer transported into the chamber 6 is held by the susceptor 74 made of quartz. After the dummy wafer is held by the susceptor 74, the halogen lamps HL turn on. Light emitted from the halogen lamps HL is transmitted through the lower chamber window 64 and the susceptor 74 both made of quartz, and impinges upon the back surface of the dummy wafer. By receiving the light irradiation from the halogen lamps HL, the dummy wafer is heated, so that the temperature of the dummy wafer increases.

Figure 8:
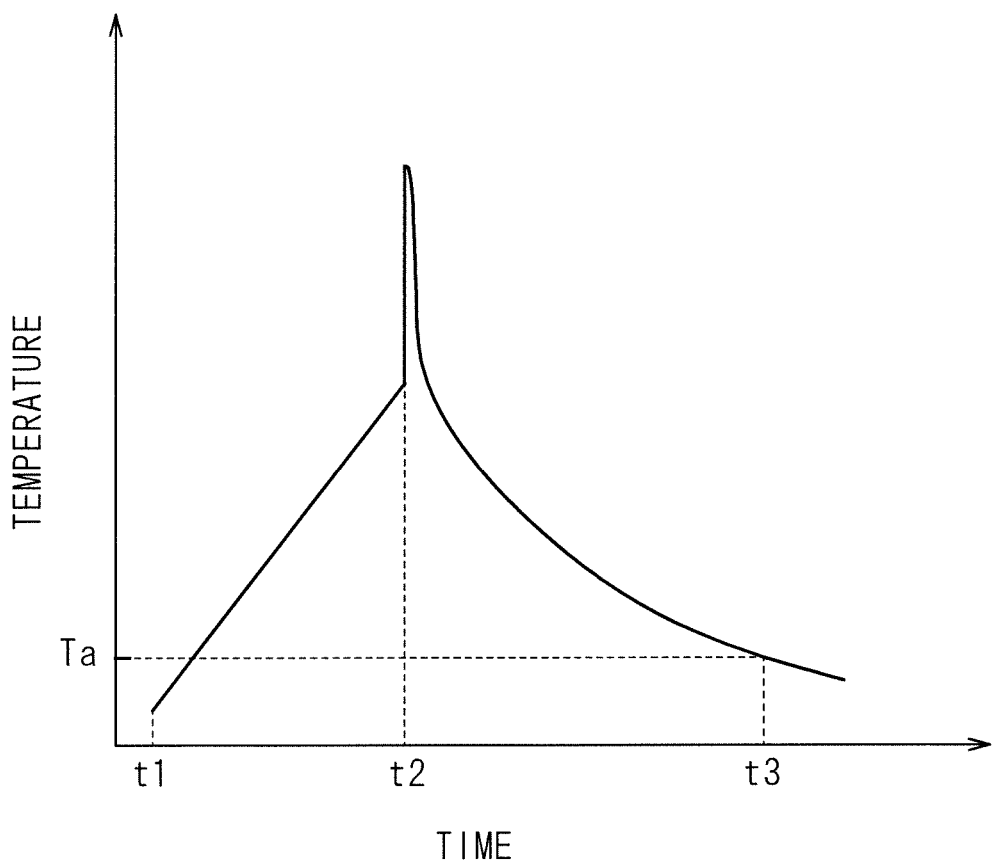
FIG. 8 is a graph showing changes in temperature of a single dummy wafer during dummy treatment.

FIG. 8 is a graph showing changes in temperature of a single dummy wafer during the dummy treatment. In FIG. 8, the ordinate represents the temperature of the back surface of the dummy wafer measured with the lower radiation thermometer 20. At time t1, the halogen lamps HL turn on, so that the increase in temperature of the dummy wafer starts. At time t2 when the back surface temperature of the dummy wafer reaches a predetermined temperature, the flash lamps FL emit light. A flash of light emitted from the flash lamps FL impinges upon the front surface of the dummy wafer. The temperature of the dummy wafer flash heated by the flash irradiation further increases. Heat transfer and heat radiation from the dummy wafer increased in temperature also increase the temperature of the in-chamber structures including the susceptor 74 and the like.

The time period of flash irradiation from the flash lamps FL is on the order of 0.1 to 100 milliseconds, as described above. In other words, the flash lamps FL emit light at the time t2 and turn off approximately at the same time. Also, the halogen lamps HL turn off at the same time that the flash lamps FL turn off. The turning off of the flash lamps FL and the halogen lamps HL causes the temperature of the dummy wafer to decrease rapidly.

The lower radiation thermometer 20 measures the back surface temperature of the dummy wafer at time t3 when a predetermined time period (e.g., 30 seconds) has elapsed since the turning off of the flash lamps FL and the halogen lamps HL. The back surface temperature of the dummy wafer measured with the lower radiation thermometer 20 at the time t3 is a judgment temperature Ta for judgment as to whether the temperature of the in-chamber structures including the susceptor 74 and the like is stabilized or not. After the judgment temperature Ta is measured, the dummy wafer is transported out of the chamber 6. The transport of the dummy wafer out of the chamber 6 is similar in procedure to the aforementioned transport of the semiconductor wafer W out of the chamber 6.

In the present preferred embodiment, multiple dummy wafers are sequentially transported into the chamber 6 and subjected to the aforementioned treatment repeatedly before the first semiconductor wafer W in a lot to be treated is transported into the chamber 6. Heat transfer and heat radiation from the multiple dummy wafers increased in temperature preheat the in-chamber structures including the susceptor 74 and the like.

Figure 9:
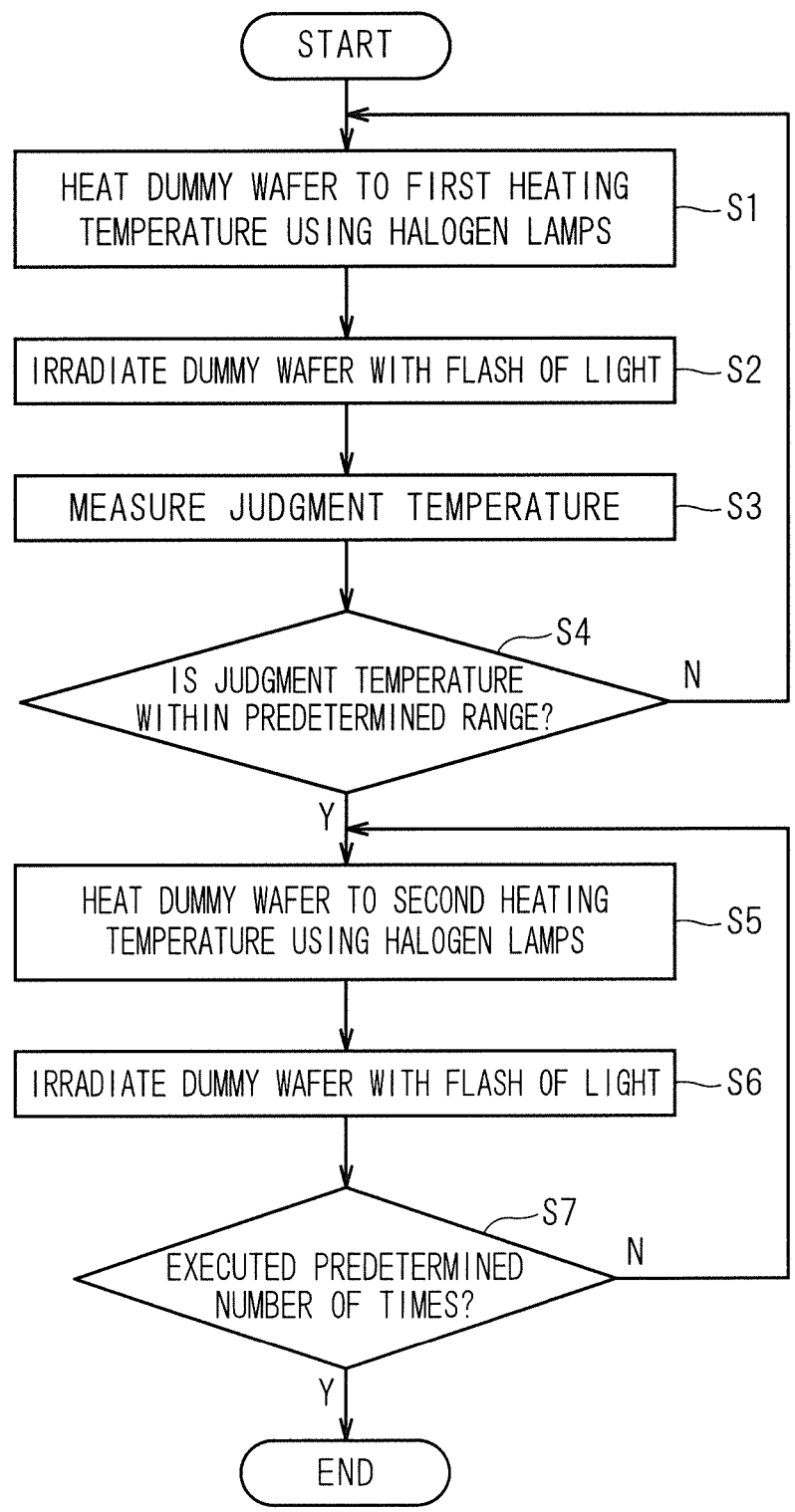
FIG. 9 is a flow diagram showing a procedure for the dummy treatment according to a first preferred embodiment.

FIG. 9 is a flow diagram showing a procedure for the dummy treatment according to the present preferred embodiment. FIG. 10 is a graph showing changes in temperature of multiple dummy wafers during the dummy treatment according to the first preferred embodiment. The temperature of the dummy wafers shown in FIG. 10 is the back surface temperature of the dummy wafers measured with the lower radiation thermometer 20.

First, the first one of the multiple dummy wafers is transported into the chamber 6 and held by the susceptor 74. The first dummy wafer is heated to a first heating temperature TF by the light irradiation from the halogen lamps HL (Step S1). At the point in time when the temperature of the first dummy wafer reaches the first heating temperature TF, the first dummy wafer is irradiated with a flash of light from the flash lamps FL, so that the temperature of the first dummy wafer further increases from the first heating temperature TF (Step S2). Heat transfer and heat radiation from the first dummy wafer increased in temperature also increase the temperature of the in-chamber structures including the susceptor 74 and the like.

Next, the flash lamps FL and the halogen lamps HL turn off, so that the temperature of the first dummy wafer decreases rapidly. Then, the lower radiation thermometer 20 measures the back surface temperature of the first dummy wafer at the point in time when a predetermined time period has elapsed since the turning off of the flash lamps FL and the halogen lamps HL as the judgment temperature Ta (Step S3). The judgment temperature Ta measured with the lower radiation thermometer 20 is transmitted to the controller 3. After the judgment temperature Ta is obtained, the first dummy wafer is transported out of the chamber 6.

The controller 3 judges whether the judgment temperature Ta is within a predetermined range with respect to a target temperature Tt or not (Step S4). For example, if the target temperature Tt is 150° C., the controller 3 judges whether the judgment temperature Ta is within ±10% of the target temperature Tt (within the range of 135° to 165° C.) or not.

If the judgment temperature Ta is not within the predetermined range with respect to the target temperature Tt, the second one of the multiple dummy wafers is transported into the chamber 6, and the processes in Steps S1 to S4 are repeated. Then, if the judgment temperature Ta of the second dummy wafer is not within the predetermined range with respect to the target temperature Tt, the third one of the multiple dummy wafers is transported into the chamber 6, and the processes in Steps S1 to S4 are repeated. That is, the processes in Steps S1 to S4 are repeated until the judgment temperature Ta falls within the predetermined range with respect to the target temperature Tt.

FIG. 11 is a graph showing transitions of the judgment temperature Ta. In the example of FIG. 11, the judgment temperatures Ta of the first and second dummy wafers are outside the predetermined range with respect to the target temperature Tt (the range between an upper-limit temperature TU and a lower-limit temperature TL). For this reason, the processes in Steps S1 to S4 are performed on the first to third ones of the multiple dummy wafers. In other words, the first to third ones of the multiple dummy wafers are heated to the first heating temperature TF by the light irradiation from the halogen lamps HL. The reason why the judgment temperature Ta increases as the number of dummy wafers increases is that heat transfer and heat radiation from the dummy wafers increased in temperature increase the temperature of the susceptor 74 to reduce the speed at which the temperatures of the dummy wafers decrease.

On the other hand, if the judgment temperature Ta is within the predetermined range with respect to the target temperature Tt, the procedure proceeds from Step S4 to Step S5. In the aforementioned example, the fourth and subsequent dummy wafers proceed to Step S5 because the judgment temperature Ta of the third dummy wafer is within the predetermined range with respect to the target temperature Tt. Specifically, the fourth dummy wafer is transported into the chamber 6 and held by the susceptor 74. Thereafter, the fourth dummy wafer is heated to a second heating temperature TS by the light irradiation from the halogen lamps HL. The second heating temperature TS is lower than the first heating temperature TF. The second heating temperature TS is equal to the temperature to which the semiconductor wafer W to be treated is heated by irradiating the semiconductor wafer W with light from the halogen lamps HL (i.e. the preheating temperature T1).

At the point in time when the temperature of the fourth dummy wafer reaches the second heating temperature TS, the fourth dummy wafer is irradiated with a flash of light from the flash lamps FL, so that the temperature of the fourth dummy wafer further increases from the second heating temperature TS (Step S6). Heat transfer and heat radiation from the fourth dummy wafer increased in temperature also increase the temperature of the in-chamber structures including the susceptor 74 and the like.

Thereafter, a judgment is made as to whether the processes in Steps S5 and S6 have been executed a predetermined number of times or not (Step S7). If the processes in Steps S5 and S6 have not yet been executed the predetermined number of times, the processes in Steps S5 and S6 are repeated for a new dummy wafer. In the present preferred embodiment, the processes in Steps S5 and S6 are repeatedly executed on the fourth to sixth dummy wafers, as shown in FIG. 10.

As shown in FIG. 11, the judgment temperature Ta of the sixth dummy wafer is approximately equal to the target temperature Tt. When the judgment temperature Ta of a dummy wafer is equal to the target temperature Tt, the temperature of the in-chamber structures including the susceptor 74 and the like has reached the stabilized temperature. In other words, the target temperature Tt is the judgment temperature Ta of the dummy wafers at which the temperature of the in-chamber structures including the susceptor 74 and the like reaches the stabilized temperature. The target temperature Tt is a parameter dependent on the preheating temperature T1 and the treatment temperature T2 of the semiconductor wafer W to be treated. The higher the preheating temperature T1 or the higher the treatment temperature T2 is, the higher the target temperature Tt is.

After the sixth dummy wafer is transported out of the chamber 6, the first semiconductor wafer W in a lot to be treated is transported into the chamber 6 and subjected to the aforementioned heat treatment operation. At the point in time when the sixth dummy wafer is transported out of the chamber 6, the temperature of the in-chamber structures including the susceptor 74 and the like has been the stabilized temperature, so that the temperature of the in-chamber structures is constant for all of the semiconductor wafers W in the lot. As a result, a uniform temperature history is achieved for all of the semiconductor wafers W in the lot.

In the first preferred embodiment, the first to third dummy wafers (a first group of dummy wafers) among the multiple dummy wafers are heated to the first heating temperature TF by the light irradiation from the halogen lamps HL, whereas the fourth to sixth dummy wafers (a second group of dummy wafers) among the multiple dummy wafers are heated to the second heating temperature TS by the light irradiation from the halogen lamps HL. That is, the first few ones of the multiple dummy wafers are heated to a high temperature, and the subsequent few ones of the multiple dummy wafers are heated to a relatively low temperature (equal to the preheating temperature T1). In summary, the dummy wafers are heated in two stages by the light irradiation from the halogen lamps HL. In this manner, the susceptor 74 and the like are strongly heated by the first group of dummy wafers heated to a higher temperature as compared with the process of heating the first and subsequent dummy wafers to a temperature equal to the preheating temperature T1. Thereafter, the susceptor 74 and the like are accurately temperature-controlled to the stabilized temperature by the second group of dummy wafers heated to the temperature equal to the preheating temperature T1. As a result, this allows the temperature of the in-chamber structures including the susceptor 74 and the like to reach the stabilized temperature in a shorter time with fewer dummy wafers. In other words, the procedure as in the present preferred embodiment is capable of stabilizing the temperature of the in-chamber structures efficiently in a short time.

The first heating temperature TF is 5° to 100° C. higher than the second heating temperature TS. For example, when the preheating temperature T1 for the semiconductor wafer W to be treated is 700° C., the second heating temperature TS is 700° C. which is equal to the preheating temperature T1, and the first heating temperature TF is in the range of 705° to 800° C. If the temperature difference between the first heating temperature TF and the second heating temperature TS is less than 5° C., the effect of strongly heating the susceptor 74 and the like cannot be obtained when the dummy wafers are heated to the first heating temperature TF. If the first heating temperature TF is higher than the second heating temperature TS by greater than 100° C., variations occur in temperature of the in-chamber structures including the susceptor 74 and the like.

In the first preferred embodiment, the number of dummy wafers to be heated to the first heating temperature TF by the light irradiation from the halogen lamps HL is in the range of 1 to 10. Also, the number of dummy wafers to be heated to the second heating temperature TS by the light irradiation from the halogen lamps HL is in the range of 1 to 10. The smaller the number of dummy wafers used is, the faster the temperature in the chamber is stabilized.

Second Preferred Embodiment

Next, a second preferred embodiment of the present invention will be described. The heat treatment apparatus 1 of the second preferred embodiment is similar in configuration to that of the first preferred embodiment. The second preferred embodiment is also similar in procedure for the treatment of the semiconductor wafer W to the first preferred embodiment. In the first preferred embodiment, the dummy wafers are heated by the light irradiation from the halogen lamps HL in two stages: the first heating temperature TF and the second heating temperature TS. In the second preferred embodiment, the first heating temperature is decreased stepwise.

FIG. 12 is a graph showing changes in temperature of multiple dummy wafers during the dummy treatment according to the second preferred embodiment. The temperature of the dummy wafers shown in FIG. 12 is the back surface temperature of the dummy wafers measured with the lower radiation thermometer 20.

In the second preferred embodiment, the first one of the multiple dummy wafers is heated to a first heating temperature TF1 by the light irradiation from the halogen lamps HL, and is irradiated with a flash of light from the flash lamps FL. Next, the second dummy wafer is heated to a first heating temperature TF2 lower than the first heating temperature TF1 by the light irradiation from the halogen lamps HL, and is irradiated with a flash of light from the flash lamps FL. Further, the third dummy wafer is heated to a first heating temperature TF3 lower than the first heating temperature TF2 by the light irradiation from the halogen lamps HL, and is irradiated with a flash of light from the flash lamps FL.

The judgment temperature Ta of the third dummy wafer is within the predetermined range with respect to the target temperature Tt, and the fourth dummy wafer is heated to the second heating temperature TS by the light irradiation from the halogen lamps HL. The second heating temperature TS is lower than the first heating temperature TF3. In the second preferred embodiment, the second heating temperature TS is also equal to the temperature to which the semiconductor wafer W to be treated is heated by irradiating the semiconductor wafer W with light from the halogen lamps HL (i.e. the preheating temperature T1).

The temperature difference between each of the first heating temperatures TF1, TF2 and TF3 and the second heating temperature TS is in the range of 5° to 100° C. For example, when the preheating temperature T1 for the semiconductor wafer W to be treated is 700° C., the second heating temperature TS is 700° C. which is equal to the preheating temperature T1, the first heating temperature TF1 is 800° C., the first heating temperature TF2 is 740° C., and the first heating temperature TF3 is 710° C.

Each of the fourth and fifth dummy wafers is heated to the second heating temperature TS by the light irradiation from the halogen lamps HL, and is irradiated with a flash of light from the flash lamps FL. After the treatment of the fifth dummy wafer is completed, the first semiconductor wafer W in a lot to be treated is transported into the chamber 6 and subjected to the aforementioned heat treatment operation.

In the second preferred embodiment, the first heating temperature to which the first to third dummy wafers among the multiple dummy wafers are heated by the light irradiation from the halogen lamps HL is decreased stepwise. Then, the fourth and subsequent dummy wafers are heated to the second heating temperature TS by the light irradiation from the halogen lamps HL. That is, the first few ones of the multiple dummy wafers are heated to high temperatures, and the subsequent few ones of the multiple dummy wafers are heated to a relatively low temperature, as in the first preferred embodiment. This also allows the temperature of the in-chamber structures including the susceptor 74 and the like to reach the stabilized temperature in a shorter time with fewer dummy wafers as compared with the process of heating the first and subsequent dummy wafers to a temperature equal to the preheating temperature T1. In other words, the procedure as in the second preferred embodiment is capable of stabilizing the temperature of the in-chamber structures efficiently in a short time.

Decreasing the first heating temperature stepwise for the first few dummy wafers allows the judgment temperature Ta to gradually approach the target temperature Tt, whereby the temperature of the in-chamber structures including the susceptor 74 and the like reaches the stabilized temperature.

Third Preferred Embodiment

Next, a third preferred embodiment of the present invention will be described. The heat treatment apparatus 1 of the third preferred embodiment is similar in configuration to that of the first preferred embodiment. The third preferred embodiment is also similar in procedure for the treatment of the semiconductor wafer W to the first preferred embodiment. In the first preferred embodiment, the dummy wafers are heated in two stages by the light irradiation from the halogen lamps HL. In the third preferred embodiment, the dummy wafers are heated in two stages by the flash irradiation from the flash lamps FL.

FIG. 13 is a graph showing changes in temperature of multiple dummy wafers during the dummy treatment according to the third preferred embodiment. The temperature of the dummy wafers shown in FIG. 13 is the front surface temperature of the dummy wafers measured with the upper radiation thermometer 25.

In the third preferred embodiment, the temperature to which all of the dummy wafers are heated by the light irradiation from the halogen lamps HL is constant. After the first to third dummy wafers (a first group of dummy wafers) among the multiple dummy wafers are heated by the light irradiation from the halogen lamps HL, the attained front surface temperature of the first to third dummy wafers is increased to a first heating temperature TP by the flash irradiation from the flash lamps FL. After the fourth and fifth dummy wafers (a second group of dummy wafers) among the multiple dummy wafers are heated by the light irradiation from the halogen lamps HL, the attained front surface temperature of the fourth and fifth dummy wafers is increased to a second heating temperature TQ by the flash irradiation from the flash lamps FL. The second heating temperature TQ is lower than the first heating temperature TP. In the third preferred embodiment, the intensity of flashes of light impinging upon the first group of dummy wafers is higher than that of flashes of light impinging upon the second group of dummy wafers, so that the attained front surface temperature of the first group of dummy wafers during the flash irradiation is higher than that of the second group of dummy wafers.

In this manner, the susceptor 74 and the like are strongly heated by the first group of dummy wafers heated to the high temperature. As a result, as in the first preferred embodiment, this allows the temperature of the in-chamber structures including the susceptor 74 and the like to reach the stabilized temperature in a shorter time with fewer dummy wafers.

<Modifications>

While the preferred embodiments according to the present invention have been described hereinabove, various modifications of the present invention in addition to those described above may be made without departing from the scope and spirit of the invention. For example, the back surface temperature of the dummy wafers measured with the lower radiation thermometer 20 is used as the judgment temperature Ta in the first preferred embodiment. However, the judgment temperature is not limited to the back surface temperature of the dummy wafers. The atmosphere temperature in the chamber 6 may be measured as the judgment temperature. Specifically, a dummy wafer is heated to the first heating temperature TF by the light irradiation from the halogen lamps HL, and is then irradiated with a flash of light from the flash lamps FL. The atmosphere temperature in the chamber 6 at the point in time when a predetermined time period has elapsed since the turning off of the flash lamps FL and the halogen lamps HL during this treatment is measured with the temperature sensor 95 as the judgment temperature. Then, after the judgment temperature falls within the predetermined range with respect to the target temperature, the dummy wafer is heated to the second heating temperature TS by the light irradiation from the halogen lamps HL. This produces effects similar to those of the first preferred embodiment.

The target temperature Tt is a parameter dependent on the preheating temperature T1 and the treatment temperature T2 of the semiconductor wafer W to be treated, and is determined from the preheating temperature T1 and the treatment temperature T2. In this process, the preheating temperature T1, the treatment temperature T2, and the target temperature Tt may be stored by machine learning, and the target temperature Tt may be determined based on the new preheating temperature T1 and the like.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell.

While the invention has been described in detail, the foregoing description is in all aspects illustrative and not restrictive. It is understood that numerous other modifications and variations can be devised without departing from the scope of the invention.

What is claimed is:

1. A method of irradiating a substrate with light to heat the substrate, said method comprising the steps of:
   (a) sequentially transporting multiple dummy wafers into a chamber and placing the dummy wafers on a susceptor before a substrate to be treated is transported into said chamber;
   (b) irradiating a back surface of each dummy wafer in a first group among said multiple dummy wafers with light from a continuous lighting lamp to heat each dummy wafer in the first group to a first heating temperature, and thereafter irradiating a front surface of each dummy wafer in the first group with a flash of light from a flash lamp to heat each dummy wafer in the first group;
   (c) measuring, as a judgment temperature, a predetermined temperature at a time when a predetermined time period has elapsed since turning off of said continuous lighting lamp and said flash lamp upon completion of heating of each dummy wafer in the first group; and
   (d) irradiating a back surface of each dummy wafer in a second group among said multiple dummy wafers with light from said continuous lighting lamp to heat each dummy wafer in the second group to a second heating temperature lower than said first heating temperature, and thereafter irradiating a front surface of each dummy wafer in the second group with a flash of light from said flash lamp to heat each dummy wafer in the second group, said step (d) being started after said judgment temperature falls within a predetermined range with respect to a target temperature,
   wherein said judgment temperature is a temperature of the back surface of each dummy wafer in the first group or an atmosphere temperature in said chamber.

2. The method according to claim 1,
   wherein said second heating temperature is a temperature to which said substrate to be treated is heated by irradiating said substrate with light from said continuous lighting lamp.

3. The method according to claim 1,
   wherein said first heating temperature is 5° to 100° C. higher than said second heating temperature.

4. The method according to claim 1,
   wherein said first heating temperature is decreased stepwise in said step (b).

5. The method according to claim 1,
   wherein the number of dummy wafers in the first group is in the range of 1 to 10.

6. The method according to claim 1,
   wherein the number of dummy wafers in the second group is in the range of 1 to 10.

7. A method of irradiating a substrate with light to heat the substrate, said method comprising the steps of:
   (a) sequentially transporting multiple dummy wafers into a chamber and placing the dummy wafers on a susceptor before a substrate to be treated is transported into said chamber;
   (b) irradiating a back surface of each dummy wafer in a first group among said multiple dummy wafers with light from a continuous lighting lamp, and thereafter irradiating a front surface of each dummy wafer in the first group with a flash of light from a flash lamp to heat each dummy wafer in the first group to a first heating temperature;
   (c) measuring, as a judgment temperature, a predetermined temperature at a time when a predetermined time period has elapsed since turning off of said continuous lighting lamp and said flash lamp upon completion of heating of each dummy wafer in the first group; and
   (d) irradiating a back surface of each dummy wafer in a second group among said multiple dummy wafers with light from said continuous lighting lamp, and thereafter irradiating a front surface of each dummy wafer in the second group with a flash of light from said flash lamp to heat each dummy wafer in the second group to a second heating temperature lower than said first heating temperature, said step (d) being started after said judgment temperature falls within a predetermined range with respect to a target temperature,
   wherein said judgment temperature is a temperature of the back surface of each dummy wafer in the first group or an atmosphere temperature in said chamber.

* * * * *